(12) United States Patent
Fukui

(10) Patent No.: US 7,256,436 B2
(45) Date of Patent: Aug. 14, 2007

(54) THIN-FILM FIELD-EFFECT TRANSISTORS AND MAKING METHOD

(75) Inventor: Ikuo Fukui, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/092,591

(22) Filed: Mar. 29, 2005

(65) Prior Publication Data
US 2005/0218450 A1 Oct. 6, 2005

(30) Foreign Application Priority Data
Mar. 30, 2004 (JP) .............................. 2004-098441

(51) Int. Cl.
*H01L 27/15* (2006.01)
*H01L 29/26* (2006.01)
*H01L 31/12* (2006.01)
*H01L 33/00* (2006.01)

(52) U.S. Cl. .................... 257/292; 257/79; 257/80; 257/82; 257/290; 257/291; 257/E31.115; 257/E27.133; 257/E25.032

(58) Field of Classification Search ............ 257/79–82, 257/290–292, E51.005
See application file for complete search history.

(56) References Cited

U.S. PATENT DOCUMENTS

| | | | |
|---|---|---|---|
| 4,322,524 A | | 3/1982 | Onda et al. |
| 5,144,473 A | * | 9/1992 | Gemma et al. ............. 359/270 |
| 5,347,144 A | | 9/1994 | Garnier et al. |
| 5,777,038 A | * | 7/1998 | Nishikawa et al. ......... 525/295 |
| 6,007,927 A | * | 12/1999 | Nishikawa et al. ......... 428/690 |
| 6,130,379 A | * | 10/2000 | Shiotsuka et al. .......... 136/251 |
| 6,541,587 B1 | | 4/2003 | Nishida et al. |
| 7,098,525 B2 | * | 8/2006 | Bai et al. .................... 257/642 |
| 2003/0071259 A1 | * | 4/2003 | Yoshida ....................... 257/40 |
| 2007/0071884 A1 | * | 3/2007 | Takeshita et al. ............. 427/66 |

FOREIGN PATENT DOCUMENTS

| | | |
|---|---|---|
| EP | 1 394 886 A1 | 3/2004 |
| GB | 2 254 625 A | 2/1981 |
| JP | 59-31521 B2 | 8/1984 |
| JP | 5-508745 A | 12/1993 |
| JP | 2002-110999 A | 4/2002 |
| WO | WO-92/01313 A1 | 1/1992 |
| WO | WO-03/052841 A1 | 6/2003 |

OTHER PUBLICATIONS

B. Bedekar et al., "Dielectric relaxation of cyanoehtylated poly (2, 3-dihydroxypropyl methacrylate)", Polymer, vol. 36, No. 25, pp. 4735-4740, 1995.*
Veres et al., Gate insulators influencing electronic transport in organic FETs, 2003, SPIE, vol. 5217.*
Peng et al., All-organic thin-film transistors made of alpha-sexithienyl semiconducting and various polymeric insulating layers, Nov. 5, 1990; Appl. Phys. Lett. 57 (19).*

* cited by examiner

Primary Examiner—Kenneth Parker
Assistant Examiner—Jesse A. Fenty
(74) Attorney, Agent, or Firm—Birch, Stewart, Kolasch & Birch, LLP

(57) ABSTRACT

In a thin-film field-effect transistor having a MIS structure, the insulator layer is formed of cyanoethylated dihydroxypropyl pullulan. The TFT is prepared by applying a cyanoethylated dihydroxypropyl pullulan solution onto a gate electrode in the form of a metal layer, drying the applied solution to form an insulator layer, and thereafter, forming a semiconductor layer thereon.

7 Claims, 1 Drawing Sheet

THIN-FILM FIELD-EFFECT TRANSISTORS AND MAKING METHOD

CROSS-REFERENCE TO RELATED APPLICATION

This non-provisional application claims priority under 35 U.S.C. §119(a) on Patent Application No. 2004-098441 filed in Japan on Mar. 30, 2004, the entire contents of which are hereby incorporated by reference.

TECHNICAL FIELD

This invention relates to thin-film field-effect transistors (TFTs) utilizing silicon semiconductor or compound semiconductor and especially suited for liquid crystal displays, and a method for preparing the same.

BACKGROUND ART

TFTs utilizing silicon semiconductor or compound semiconductor are used in general integrated circuits and other expanding applications. In particular, the use of TFTs in liquid crystal displays is well known. The recent trend taken for liquid crystal displays is to increase the display size and the image definition. It has become more desirable than ever to incorporate a multiplicity of TFTs corresponding to the number of pixels.

However, conventional metal-base semiconductors which are used in the art when circuits are formed on substrates cannot avoid introduction of small defects in TFTs formed on the substrate due to photoresist processing steps including patterning and etching. These processing steps impose a certain limit to the desire to reduce the TFT manufacturing cost. The same is true to other flat displays like plasma displays and organic EL displays if TFTs are used therein.

The recent trend toward larger display area and finer image definition leads to a propensity to increase the probability of defects in TFT manufacture. It is strongly desired to minimize TFT defects.

For TFTs having a metal/insulator/semiconductor (MIS) structure, attempts were made to form the insulator and semiconductor from organic substances. For example, JP-A 5-508745 (WO 92/01313) describes that a device fabricated using an insulating organic polymer having a dielectric constant of at least 5 as the insulating layer, and a multi-conjugated organic compound having a weight average molecular weight of up to 2,000 as the semiconductor layer exhibits a field effect and has a mobility of approximately $10^{-2}$ cm$^2$V$^{-1}$s$^{-1}$.

SUMMARY OF THE INVENTION

An object of the invention is to provide a thin-film field-effect transistor (TFT) having a higher carrier mobility than prior art TFTs and minimal defects, and a method for preparing the same.

Studying a TFT having a metal/insulator/semiconductor (MIS) structure, the inventor has found that a higher carrier mobility than in prior art TFTs is achievable using cyanoethylated dihydroxypropyl pullulan as the material of which the insulator layer is made.

The present invention in one aspect provides a thin-film field-effect transistor having an MIS structure, wherein the insulator layer is formed of cyanoethylated dihydroxypropyl pullulan.

In another aspect, a thin-film field-effect transistor is prepared by applying a cyanoethylated dihydroxypropyl pullulan solution onto a gate electrode in the form of a metal layer, drying the applied solution to form an insulator layer, and thereafter, forming a semiconductor layer thereon.

The present invention offers advantages such as minimized probability of TFT defects and reduced manufacture cost, because the use of cyanoethylated dihydroxypropyl pullulan as the material of which the insulator layer of TFT is made eliminates the photoresist processing steps including patterning and etching involved in the circuit-forming technology using metal-base semiconductor and insulator.

BRIEF DESCRIPTION OF THE DRAWING

The only FIGURE.

DESCRIPTION OF THE PREFERRED EMBODIMENTS

Figure 1:
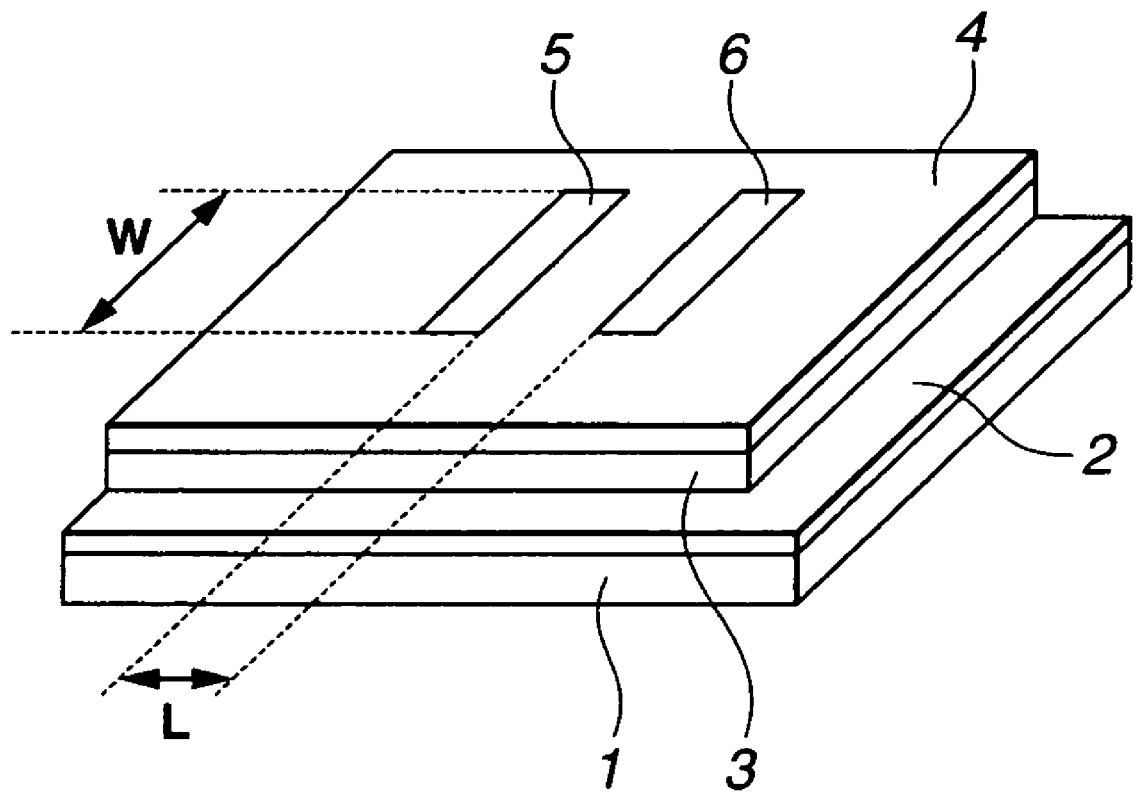
FIG. 1 is a perspective view of a TFT in one embodiment of the invention.

Referring to FIG. 1, the TFT of the invention is illustrated as comprising a substrate 1 of SiO$_2$ or the like, a metal layer 2 formed on the substrate 1 and serving as a gate electrode, an insulator layer 3 formed on the metal layer 2, and a semiconductor layer 4 formed on the insulator layer 3. Source and drain electrodes 5 and 6 are formed on the semiconductor layer 4.

The metal layer used herein may be a conventional indium tin oxide (ITO) film, or a single metal layer such as Au, Cu or Al or a metal layer laminate such as Au/Ti, Cu/Ti or Al/Ti which is formed by physical vapor deposition (PVD) or metal organic chemical vapor deposition (MOCVD). Since a possibility of film formation by printing is advantageous to the objects of the invention, the use of conductive metal paste is preferred as long as it raises no practical problems.

In the inventive TFT, the insulator layer is formed of cyanoethylated dihydroxypropyl pullulan. Desirably the cyanoethylated dihydroxypropyl pullulan is substituted with more than 3 moles of cyanoethyl groups per mole of glucose units. This is because a larger quantity of residual hydroxyl groups may lead to a larger dielectric loss, considered a loss factor, which is undesirable to the objects of the invention. The upper limit of substitution is not critical, but is typically up to 6 moles.

Also the degree of substitution with cyanoethyl groups for hydroxyl groups in a dihydroxypropyl pullulan molecule is desirably at least 75 mole %, more desirably at least 80 mole %. This is because a concentration of cyano or polar groups above a certain level is necessary to provide TFT with a fully improved mobility, and likewise because a larger quantity of residual hydroxyl groups may lead to a larger dielectric loss, considered a loss factor, which is undesirable to the objects of the invention. The upper limit of substitution degree is not critical, but is theoretically up to 100 mole %.

Cyanoethylated dihydroxypropyl pullulan is obtained by reacting a pullulan resin with glycidol in the presence of an alkali catalyst to synthesize dihydroxypropyl pullulan, then reacting it with acrylonitrile in the presence of an alkali catalyst, as described in JP-B 59-31521. More specifically, the process of preparing cyanoethylated dihydroxypropyl pullulan involves the first stage of adding glycidol to hydroxyl groups on pullulan backbone to increase the moles of hydroxyl groups within the molecule, and the second stage of adding acrylonitrile thereto to increase the maximum moles of acrylonitrile added so that the quantity of cyanoethyl groups substituted per mole of glucose units may exceed 3 moles.

Cyanoethyl pullulan can serve as an insulator layer material like the cyanoethylated dihydroxypropyl pullulan used in the invention, but has a lower mobility as will be demonstrated in Comparative Example. Since the dielectric constant at 10 kHz is 19.0 for cyanoethylated dihydroxypropyl pullulan and 18.5 for cyanoethyl pullulan, that is, equivalent between these two, the dielectric constant is not the sole factor that accounts for an improvement in mobility.

Both cyanoethylated dihydroxypropyl pullulan and cyanoethyl pullulan have a high dielectric constant since cyanoethyl groups which are polar groups within the molecule orient relative to the applied electric field.

Cyanoethyl pullulan has 3 moles of hydroxyl groups per mole of glucose units which are repeat units in the pullulan resin backbone, which means that the maximum moles of acrylonitrile added is 3 moles, namely the quantity of cyanoethyl groups substituted per mole of glucose units is 3 moles at maximum. By contrast, in the case of cyanoethylated dihydroxypropyl pullulan, the quantity of cyanoethyl groups substituted per mole of glucose units is more than 3 moles because the moles of hydroxyl groups within the molecule is increased in the first stage and acrylonitrile is added in the second stage.

The mobility of cyanoethylated dihydroxypropyl pullulan is higher than that of cyanoethyl pullulan for the reason that the former has a higher proportion per molecule of polar groups which are oriented toward the insulator layer surface at the insulator/semiconductor interface when a potential is applied to the gate than the latter, so that formation of channels is enhanced.

In the inventive TFT, the material of which the semiconductor layer is formed is not critical, but preferably an organic semiconductor. Illustrative examples include polythiophenes such as poly(3-hexylthiophene), polyanilines, polyacetylenes, poly(thienylene vinylene)s, poly(phenylene vinylene)s, pentacene, copper phthalocyanine, and α-sexithienyl. When the material of which the semiconductor layer is formed is selected from polymers, any desired polymers may be used as long as their weight average molecular weight is from more than 2,000 to 1,000,000 as measured by gel permeation chromatography (GPC) versus polystyrene standards. The polymer should be dissolvable in an organic solvent in which the insulator layer is not dissolvable. This is because the semiconductor/insulator interface otherwise becomes non-uniform when semiconductor and insulator layers are formed by overcoating or lamination.

The prior art studies on organic TFTs resulted in a method of forming an organic semiconductor layer on an organic insulator film by evaporation as described in JP-A 5-508745 and a method of forming only an organic semiconductor layer on an inorganic insulator film. In an example wherein both an organic semiconductor material and an organic insulating material are used as solutions in the same organic solvent, the organic insulating material solution is first coated and dried to form an organic insulating layer, on which the organic semiconductor material solution is coated. At the coating interface, part of the organic insulating material is dissolved again. This introduces disorders at the interface of the laminate after final drying. The present invention is successful in avoiding this problem. In an example of the invention wherein the material of which the semiconductor layer is made is a polymer, the semiconductor material and the insulating material are dissolved in organic solvents of different type. That is, either one of the materials is not dissolvable in either one of the solvents.

Examples of the organic solvent in which cyanoethylated dihydroxypropyl pullulan forming the insulator layer is dissolvable include N-methyl-2-pyrrolidone, N,N'-dimethylformamide, acetone, acetonitrile, and γ-butyrolactone. Examples of the other organic solvent in which the polymer forming the semiconductor layer is dissolvable include chloroform, toluene, hexane and alcohols. In either case, one or more solvents may be used.

In the practice of the invention, a solution of cyanoethylated dihydroxypropyl pullulan in an organic solvent is coated and dried onto a gate electrode in the form of a metal layer to form an insulating layer, after which any well-known methods may be employed to form a semiconductor layer thereon for the fabrication of a thin-film field-effect transistor. Specifically, a substrate is selected from glass or conventional polymer sheets. A metal layer serving as the gate electrode is formed on the substrate by sputtering or by applying a metal paste or conductive polymer through spin coating, screen printing or ink jet printing, and drying. Alternatively, commercially available ITO-coated glass may be used.

On the gate electrode thus formed, a solution of cyanoethylated dihydroxypropyl pullulan in an organic solvent is coated by spin coating, screen printing or ink jet printing, and dried, thus forming an insulator layer.

Thereafter, a solution of the material capable of forming a semiconductor layer is coated onto the insulator layer by spin coating, screen printing or ink jet printing, and dried to form a semiconductor layer. Alternatively, the material is evaporated in vacuum to deposit a semiconductor layer. Before this stage, the surface of the insulator layer may be subjected to well-known rubbing or physical treatment in order that semiconductor molecules be oriented at the interface between the insulator layer and the semiconductor layer.

Finally, source and drain electrodes are formed on the semiconductor layer by sputtering or by applying a metal paste or conductive polymer through screen printing or ink jet printing, and drying.

The inventive TFT has the structure that an insulator layer is formed on a gate electrode in the form of a metal layer and a semiconductor layer is formed thereon. Source and drain electrodes are formed on the semiconductor layer. When a potential is applied to the gate to create an electric field, the field effect induces electric charges within the semiconductor near the insulator layer, whereby a conductive region, called channel, is formed in the semiconductor layer between the source and drain electrodes. Therefore, the interface state between the insulator and semiconductor layers is very important. The flatter the interface, the better becomes the device operation.

EXAMPLE

Examples of the invention are given below by way of illustration and not by way of limitation.

Example 1

The material for insulator layer was cyanoethylated dihydroxypropyl pullulan in which the degree of substitution with cyanoethyl groups for hydroxyl groups in the dihydroxypropyl pullulan molecule is 83.7 mole % and the quantity of cyanoethyl groups substituted per mole of glucose units is 3.45 moles and which has a dielectric constant of 19.0 at 10 kHz. The organic material for semiconductor layer was α-sexithienyl which had been purified by Soxhlet's extractor using dichloromethane. Using these materials, a TFT was fabricated by the following procedure. It was then tested.

On a glass (SiO$_2$) substrate of 1 cm×2.5 cm, Au was vapor deposited to a thickness of 20 nm by RF sputtering at room temperature and a back pressure of $10^{-4}$ Pa, forming a gate electrode.

A 40 wt % solution of cyanoethylated dihydroxypropyl pullulan as the insulator layer material in N,N'-dimethylformamide was passed through a 0.2-μm membrane filter, spin coated, and dried at 100° C. for one hour, forming an insulator layer on the gate electrode.

On the insulator layer, α-sexithienyl was evaporated in vacuum to form a semiconductor layer having a thickness of 50 nm. Finally, Au sputtering was conducted to form source and drain electrodes having a width W of 4 mm and spaced a distance L of 90 μm (see FIG. 1).

The device thus fabricated had a mobility of $6.0 \times 10^{-1}$ cm$^2$V$^{-1}$s$^{-1}$.

COMPARATIVE EXAMPLE 1

A TFT was fabricated as in Example 1 aside from using as the insulator layer material cyanoethyl pullulan in which the degree of substitution with cyanoethyl groups for hydroxyl groups in the dihydroxypropyl pullulan molecule is 85.2 mole % and the quantity of cyanoethyl groups substituted per mole of glucose units is 2.56 moles and which has a dielectric constant of 18.5 at 10 kHz.

The device had a mobility of $4.3 \times 10^{-1}$ cm$^2$V$^{-1}$s$^{-1}$.

Japanese Patent Application No. 2004-098441 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A thin-film field-effect transistor having a metal/insulator/semiconductor structure, wherein the insulator layer is formed of cyanoethylated dihydroxypropyl pullulan.

2. The transistor of claim 1, wherein the cyanoethylated dihydroxypropyl pullulan is substituted with more than 3 moles of cyanoethyl groups per mole of glucose units.

3. The transistor of claim 1, wherein in the cyanoethylated dihydroxypropyl pullulan, at least 75% of hydroxyl groups are substituted with cyanoethyl groups.

4. The transistor of claim 1, wherein the semiconductor layer is formed from an organic semiconductor selected from the group consisting of polythiophens, polyanilines, polyacetylenes, poly(thienylene vinylene)s, poly(phenylene vinylene)s, pentacene, copper phthalocyanine and a-sexithienyl.

5. A method for preparing a thin-film field-effect transistor, comprising the steps of applying a cyanoethylated dihydroxypropyl pullulan solution onto a gate electrode in the form of a metal layer, drying the applied solution to form an insulator layer, and thereafter, forming a semiconductor layer thereon.

6. The method for preparing a thin-film field-effect transistor of claim 5, wherein the cyanoethylated dihydroxypropyl pullulan is substituted with more than 3 moles of cyanoethyl groups per mole of glucose units.

7. The method for preparing a thin-film field-effect transistor of claim 5, wherein in the cyanoethylated dihydroxypropyl pullulan, at least 75% of hydroxyl groups are substituted with cyanoethyl groups.

* * * * *